(12) United States Patent
Wagner

(10) Patent No.: US 10,756,042 B2
(45) Date of Patent: Aug. 25, 2020

(54) MULTI-LAYER REDISTRIBUTION LAYER FOR WAFER-LEVEL PACKAGING

(71) Applicant: Intel IP Corporation, Santa Clara, CA (US)

(72) Inventor: Thomas Wagner, Regelsbach (DE)

(73) Assignee: Intel IP Corporation, Santa Clara, CA (US)

( * ) Notice: Subject to any disclaimer, the term of this patent is extended or adjusted under 35 U.S.C. 154(b) by 37 days.

(21) Appl. No.: 15/390,578

(22) Filed: Dec. 26, 2016

(65) Prior Publication Data

US 2018/0182726 A1 Jun. 28, 2018

(51) Int. Cl.
| | |
|---|---|
| *H01L 23/522* | (2006.01) |
| *H01L 23/498* | (2006.01) |
| *H01L 23/00* | (2006.01) |
| *H01L 23/31* | (2006.01) |

(52) U.S. Cl.
CPC .......... *H01L 24/14* (2013.01); *H01L 23/3114* (2013.01); *H01L 23/3157* (2013.01); *H01L 23/5223* (2013.01); *H01L 23/5227* (2013.01); *H01L 24/03* (2013.01); *H01L 24/06* (2013.01); *H01L 24/11* (2013.01); *H01L 2224/16225* (2013.01); *H01L 2224/32225* (2013.01); *H01L 2224/73204* (2013.01); *H01L 2224/92125* (2013.01)

(58) Field of Classification Search
CPC . H01L 24/14; H01L 23/5223; H01L 23/3157; H01L 2924/3841; H01L 23/5227; H01L 2224/0239
See application file for complete search history.

(56) References Cited

U.S. PATENT DOCUMENTS

| | | | |
|---|---|---|---|
| 7,808,105 B1 | 10/2010 | Paek | |
| 9,099,340 B2 * | 8/2015 | Michael | ............ H01L 23/49838 |
| 2006/0108607 A1 * | 5/2006 | Teshima | .................. H01L 23/50 |
| | | | 257/207 |
| 2008/0309442 A1 * | 12/2008 | Hebert | .................. H01F 27/292 |
| | | | 336/65 |
| 2009/0020864 A1 | 1/2009 | Pu et al. | |
| 2010/0007017 A1 | 1/2010 | Wei et al. | |
| 2010/0096754 A1 | 4/2010 | Lee et al. | |

(Continued)

OTHER PUBLICATIONS

International Search Report and Written Opinion in International Application No. PCT/US2017/061898, dated Mar. 12, 2018, 15 pages.

*Primary Examiner* — Dale E Page
*Assistant Examiner* — Wilner Jean Baptiste
(74) *Attorney, Agent, or Firm* — Patent Capital Group

(57) ABSTRACT

Aspects of the embodiments include a semiconductor package that includes a printed circuit board (PCB) and a semiconductor die. The semiconductor die including an interconnect landing pad on an active side of the semiconductor die; a solder material on the interconnect landing pad; a partial redistribution layer on the active side of the semiconductor die; and a protection layer on the partial redistribution layer, the protection layer comprising the solder material. The semiconductor die is electrically connected to the PCB by the solder material on the interconnect landing pad. The partial redistribution layer and the protection layer are separated from the printed circuit board by an air gap.

25 Claims, 14 Drawing Sheets

(56) References Cited

U.S. PATENT DOCUMENTS

| | | | |
|---|---|---|---|
| 2011/0157853 A1* | 6/2011 | Goh | H01L 23/563 |
| | | | 361/783 |
| 2015/0145100 A1* | 5/2015 | Hsu | H01L 27/10814 |
| | | | 257/532 |
| 2015/0162316 A1* | 6/2015 | Yu | H01L 25/105 |
| | | | 257/704 |
| 2016/0329262 A1* | 11/2016 | Hsiao | H01L 23/49894 |

* cited by examiner

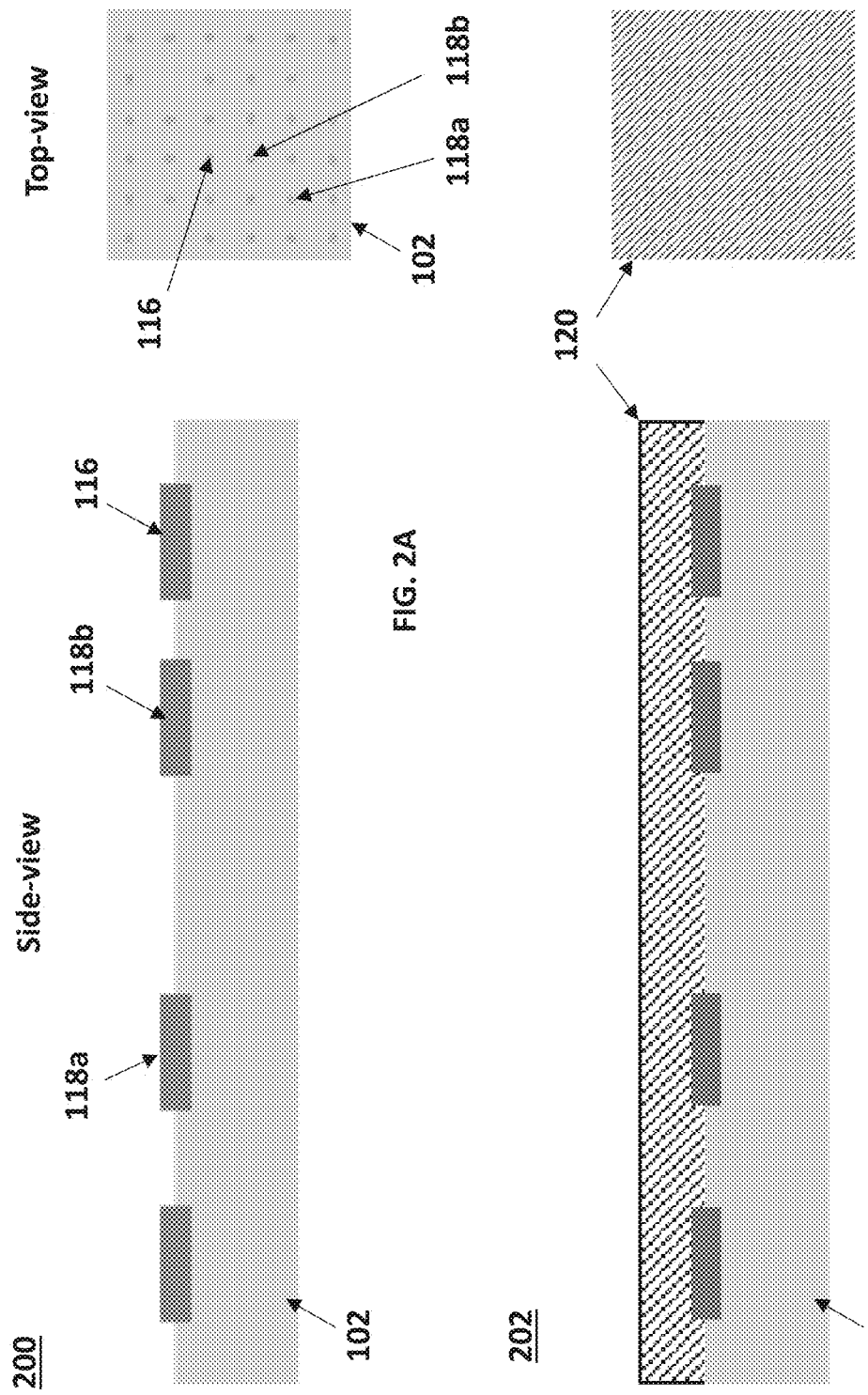

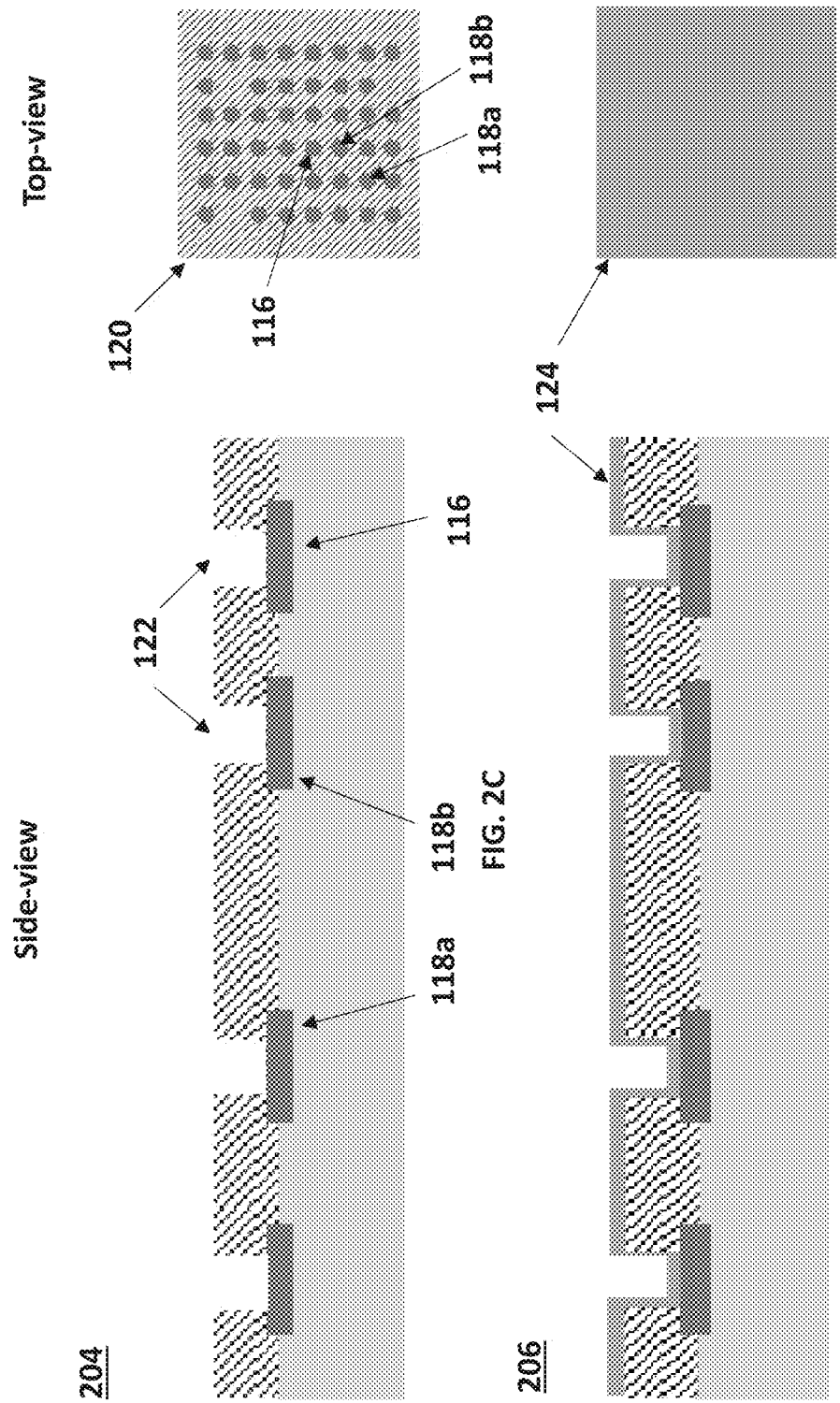

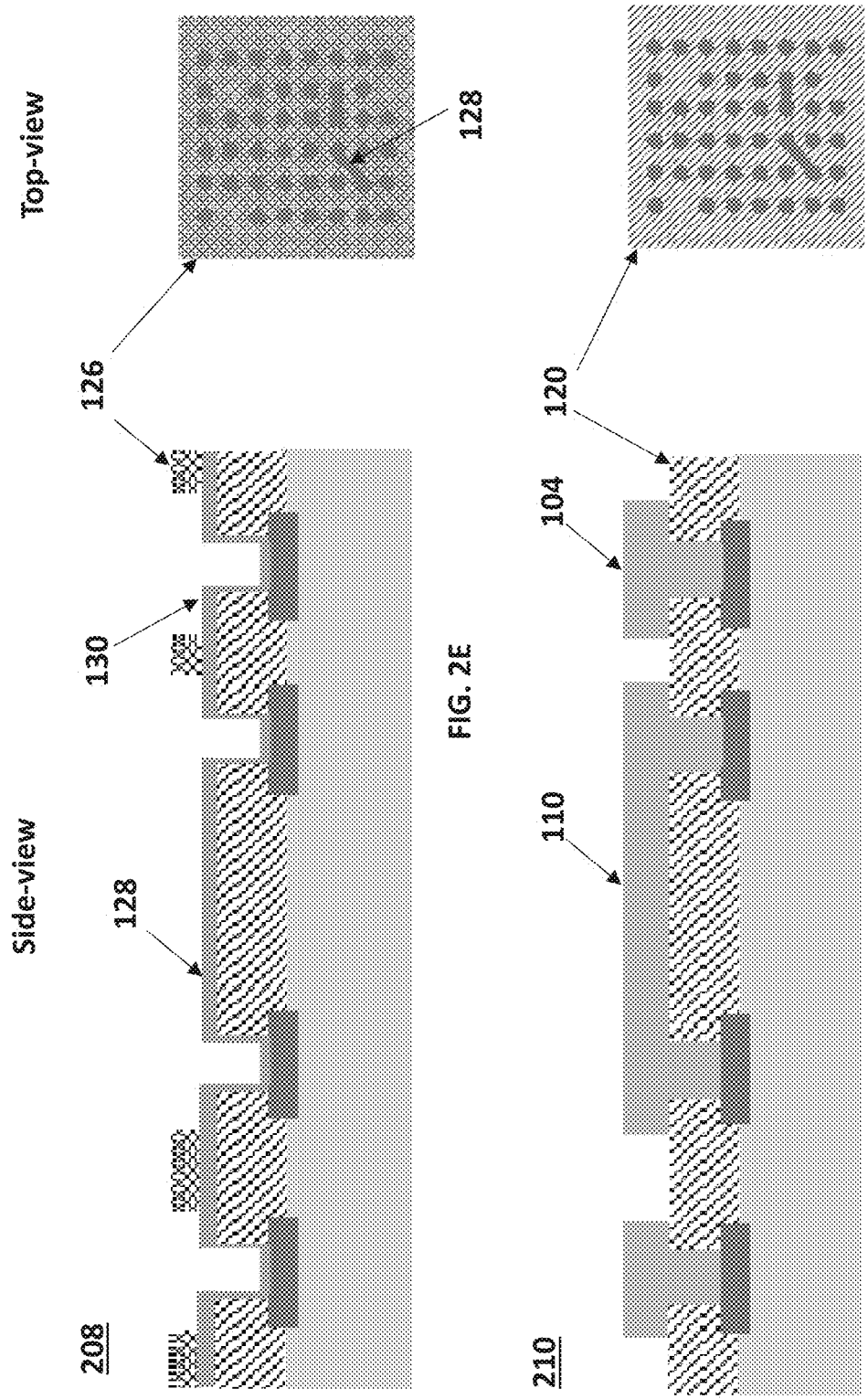

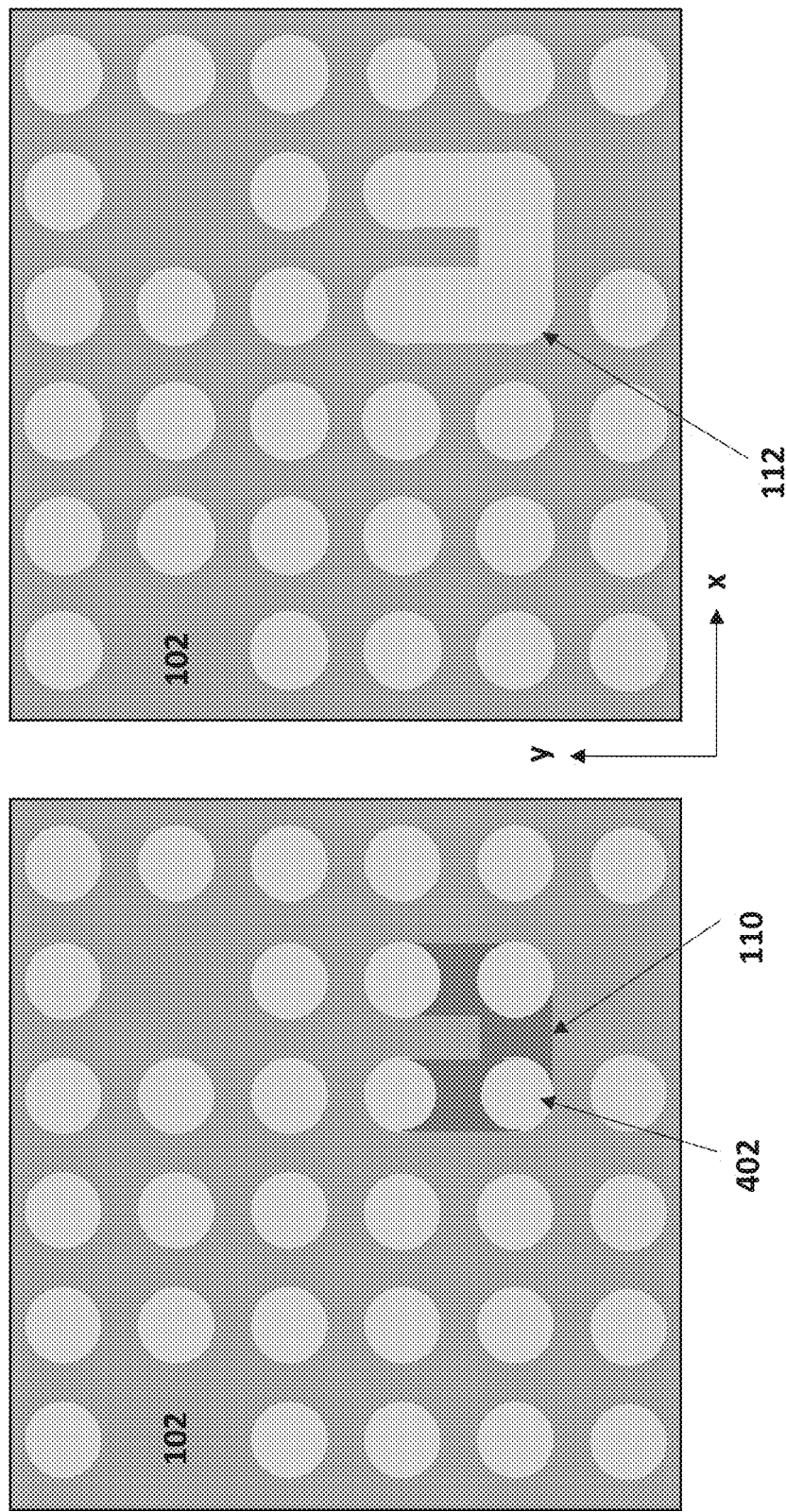

US 10,756,042 B2

MULTI-LAYER REDISTRIBUTION LAYER FOR WAFER-LEVEL PACKAGING

TECHNICAL FIELD

This disclosure pertains to partial low-cost multi-layer redistribution layers for wafer-level packaging.

BACKGROUND

Wafer-level packaging can involve processing and manufacturing techniques that add cost and complexity to overall production. Cost optimized packages are mandatory to be competitive on the market. Cost and complexity of producing WLP can also increase with the added demands of overall package size reduction and the desire to add circuit elements to the WLP.

BRIEF DESCRIPTION OF THE DRAWINGS

FIGS. 2A-2F are schematic diagrams of an example process flow for forming a solder-based redistribution layer protectant in accordance with embodiments of the present disclosure.

FIGS. 4A-4B are schematic diagrams of a bottom-side view of a wafer-level package with a redistribution layer patterned as a circuit element in accordance with embodiments of the present disclosure.

Features of the figures are not drawn to scale; however, relative feature sizes can be specified within the scope of this disclosure.

DETAILED DESCRIPTION

This disclosure describes using solder formation and reflow techniques to create a partial redistribution layer (RDL) protection layer. This disclosure describes using the effect of drift and collapse of solder material along the metal partial RDL surface during a reflow process to gain a metal coverage and therefore a protection of partial RDL structures.

The present disclosure can realize a partial RDL protection layer under the die/package without requiring a dedicated process step for the protection layer against corrosion of the RDL metal, such as the formation of a dielectric, solder stop or additional noble metals (e.g. NiAu). This costly process can be avoided, therefore, the present disclosure provides for a cost-savings advantage for the packaging.

Figure 1:
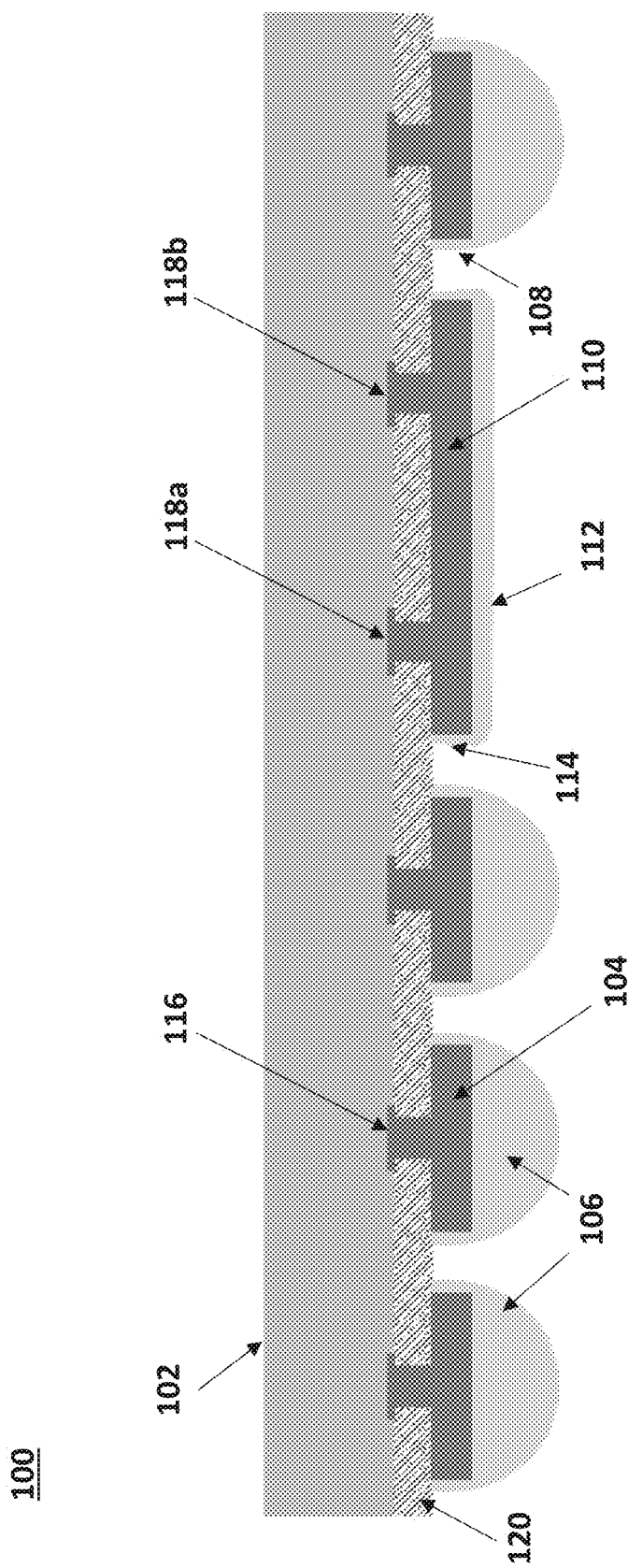
FIG. 1 is a schematic diagram of a wafer-level package that includes a solder-based redistribution layer protectant in accordance with embodiments of the present disclosure.

FIG. 1 is a schematic diagram of a wafer-level package 100 that includes a solder-based protectant 112 on a redistribution layer protectant 110 in accordance with embodiments of the present disclosure. The wafer-level package (WLP) 100 includes a semiconductor die 102. The semiconductor die 102 can include one or more circuit elements grown from standard semiconductor processing techniques. The semiconductor die 102 can include a die pad 116 that is electrically connected to a circuit element within the semiconductor die 102. It is understood that a plurality of die pads can be formed to connect with any circuit element within the semiconductor die 102. The die pad 116 is electrically connected to an interconnect landing pad 104. The interconnect landing pad 104 can be a copper pillar or under-bump metal (UBM) pad or other metal surface for interconnecting the circuit elements within the semiconductor die 102 with external circuits, such as those on or within a printed circuit board. As shown in FIG. 1, a solder bump 106 can cover the interconnect landing pad 104. The solder bump 106 is shown to have been melted (or undergone reflow) so that the solder bump covers the interconnect landing pad 104 as well as the sidewalls 108 of the interconnect landing pad 104, the solder bump 106 essentially encasing the interconnect landing pad 104. The solder bump 106 can drift and collapse under heat to melt and flow over the metal interconnect landing pad 104 based on typical solder reflow mechanisms.

The semiconductor die 102 can also include a die pad 118a and a die pad 118b, each of which are similar to die pad 116. The semiconductor die 102 also includes a partial redistribution layer (RDL) 110 that electrically connects die pad 118a to die pad 118b. The partial RDL 110 can be copper or other conductive metal. The partial RDL 110 can be patterned (e.g., based on a resist-based patterning) to interconnect different die pads on the semiconductor die. The partial RDL 110 is covered by protection layer 112 composed of a solder material (i.e., the same solder material used for solder bump 106). The protection layer 112 is lower in height than the solder bump 106. This is due, in part, because the solder used to form the protection layer 112 drifts across a larger metalized area on the partial RDL 110 than in the case of solder bump 106, which only covers the interconnect landing pad 104. The protection layer 112 can cover a sidewall 114 of the partial RDL 110, essentially encapsulating the partial RDL 110 in solder material.

In embodiments, a dielectric layer 120 can electrically isolate the interconnect pads 104 from each other and from the partial RDL 110. The dielectric layer 120 can be an oxide layer, a polymer, or other insulating material.

The use of the solder material allows for the creation of a protection layer 112 over the partial RDL 110 without requiring an additional processing step for applying a solder resist to protect the RDL 110. In addition, the reflow of the solder can cause the solder bumps to cover the sidewalls 114 of the partial RDL 110 as well as the sidewalls 108 of the interconnect landing pads 106. The amount of solder material can be selected to prevent solder overflow, which could cause short circuits between adjacent solder bumps. The dielectric layer 120 can also restrict solder flow and protect the underlying semiconductor die from short circuits from the solder flow. The amount of solder can be the same for each solder ball formed, thereby streamlining the formation of solder balls on each interconnect landing pad and partial RDL solder location.

FIGS. 2A-2F are schematic diagrams of an example process flow for forming a solder-based redistribution layer protectant in accordance with embodiments of the present disclosure. In FIGS. 2A-2F, a side view is shown next to a "top-down" view. The "top-down" view is illustrating an active side of the semiconductor die 102 to show how a patterned partial RDL can be formed. FIG. 2A illustrates a semiconductor die 102 that includes open die pads 116 and 118a-118b (200). The die pads 116 and 118a-b can be patterned and formed using known techniques. The die pads can be aluminum, copper, or other conductive metal, and can electrically connect circuit elements within the semiconductor die 102 to external circuit elements. In FIG. 2B, the surface of the semiconductor die 102 and the surfaces of the die pads 116 and 118a-b are covered by a dielectric layer 120 (202). The dielectric layer 120 can be an oxide, polymer, or other insulating material, and can be formed using known techniques.

FIG. 2C illustrates an etching step of the dielectric 120 (204) to create openings 122 to expose the die pads 116 and 118a-b. The dielectric can be etched or lasered to expose the die pads 116 and 118a-b. Etching the dielectric to expose the die pads can include a patterned resist process, known in the art. In FIG. 2D, a seed layer 124 is formed on the surface of the remaining dielectric 120, the die pads 116 and 118a-b, and on the sidewalls of the openings 122 to the die pads 116 and 118a-b (206). The seed layer 124 can be deposited through epitaxial growth, sputtering techniques, physical or chemical deposition, or other known techniques. The seed layer 124 can be a seed layer for copper formation. In FIG. 2E, the seed layer 124 can be patterned (208). A resist 126 can be used for patterning the partial RDL (at area 128 in FIG. 2E) and the interconnect landing pads (at area 130 in FIG. 2E). The resist 126 can ensure copper formation on exposed areas (e.g., areas 128 and 130). In FIG. 2F, the copper is grown from the seed layer (e.g., through deposition, sputtering, electroplating, etc.) to form the partial RDL 110 and the interconnect landing pads 104 (210). The resist can be stripped, as well as any remaining exposed seed layer.

Figure 3A:
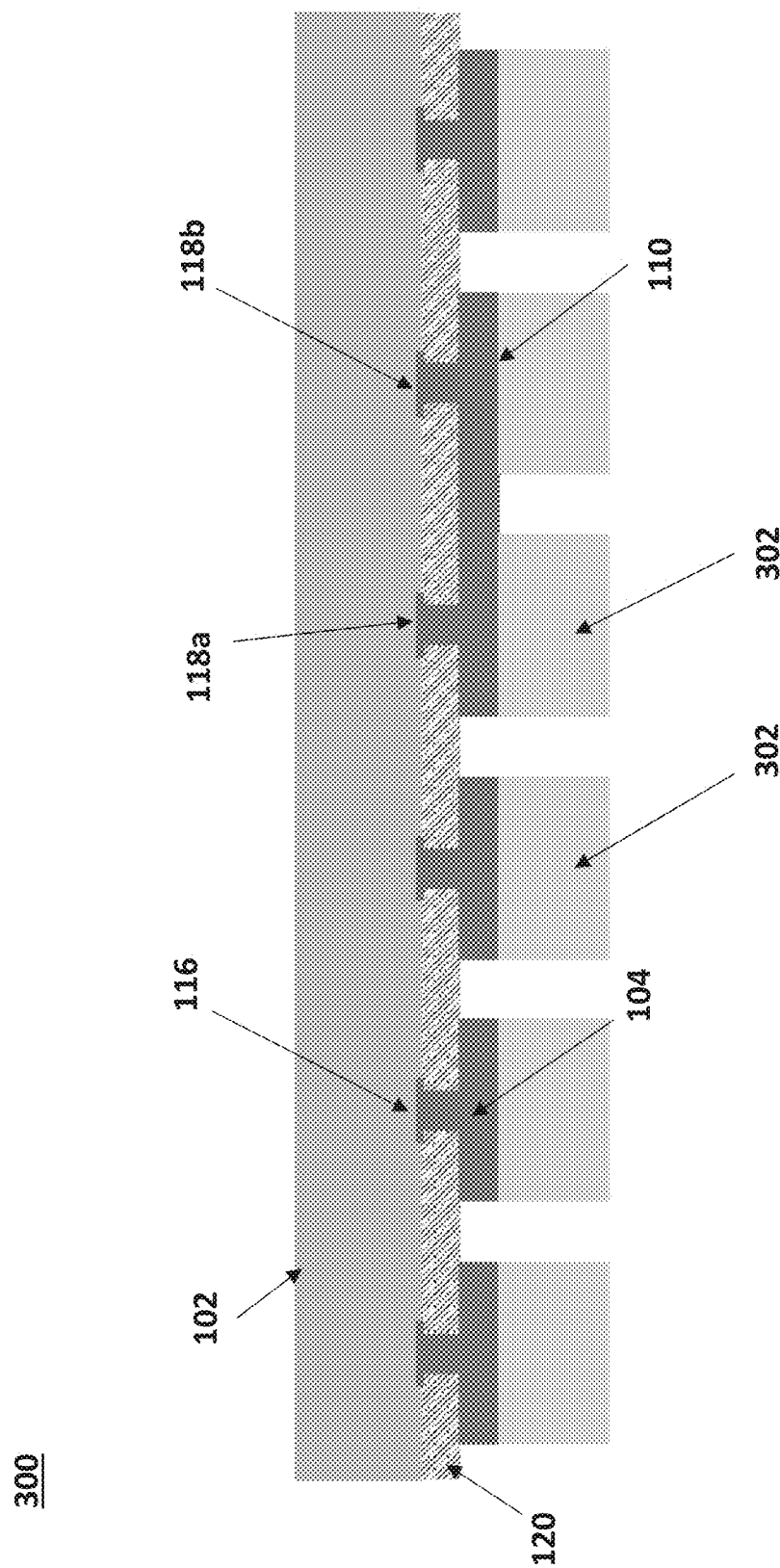
FIGS. 3A-3B are schematic diagrams of example embodiments of a wafer-level package that includes example solder formation in accordance with embodiments of the present disclosure.
Figure 3B:
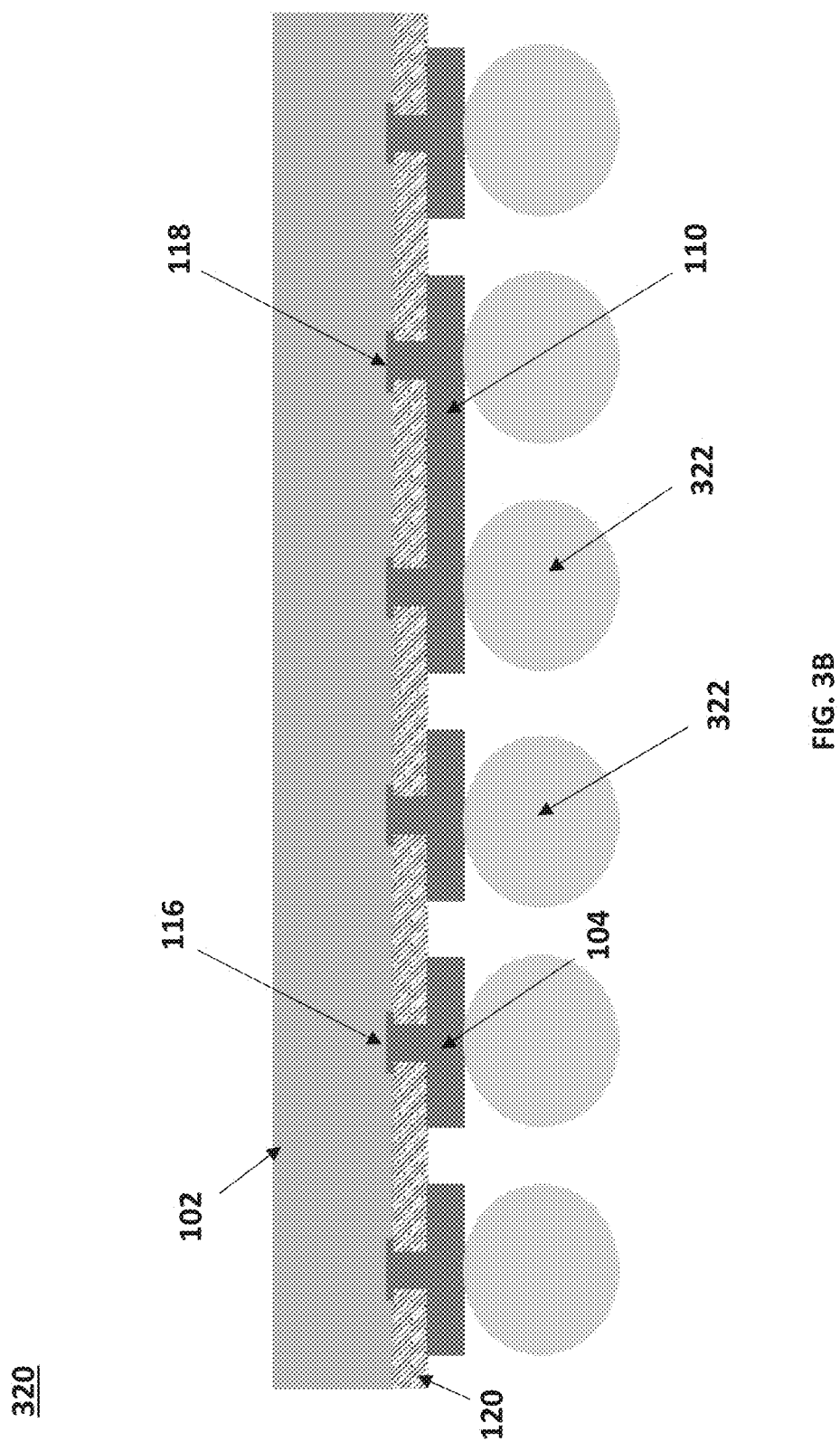

FIGS. 3A-3B are schematic diagrams of example embodiments of a wafer-level package that includes example solder formation in accordance with embodiments of the present disclosure. Once the partial RDL 110 and the interconnect landing pads 104 are formed, solder balls 302 can be placed onto the interconnect landing pads 104. In the same process, solder balls having the same size (volume, shape, etc.) can be formed at locations on the partial RDL 110 corresponding to the underlying die pad locations (e.g., die pad 118a and die pad 118b, and any other die pads underlying the partial RDL).

FIG. 3A illustrates an example semiconductor die 300 that includes solder balls 302 can be formed by solder printing, electro-plating, sputtering, or other techniques before reflow. FIG. 3B illustrates an example semiconductor die 320 that includes solder balls 322 can be placed onto the interconnect landing pads 104 and onto the partial RDL as described above. In either case, a single solder formation process FIGS. 4A-4B are schematic diagrams of a bottom-side view of a wafer-level package with a redistribution layer patterned as a circuit element in accordance with embodiments of the present disclosure. FIG. 4A is a schematic diagram of a top-down view 400 of the active side of the semiconductor die 102. In FIG. 4A, the solder balls 402 have not yet undergone reflow. Therefore, the partial RDL 110 is shown to be exposed. The solder balls 402 are formed in a pattern to cover each interconnect landing pad. The solder balls 402 also cover portions of the partial RDL corresponding to an underlying die pad position. FIG. 4B is a schematic diagram of a top-down view 420 of the semiconductor die 102 after solder reflow. The solder balls 402 melt and drift and collapse from the reflow process. The solder on the partial RDL covers the partial RDL to form the protection layer 112. Because the amount of solder is the same for the interconnect landing pads as the amount for the partial RDL and because the partial RDL is a larger area, the protection layer 112 is lower in height (or put differently, is less thick) than the solder bumps covering the interconnect landing pads. In embodiments, an amount of solder can be selected to cover the sidewalls of the interconnect landing pads and the sidewalls of the partial RDL.

Figure 5A:
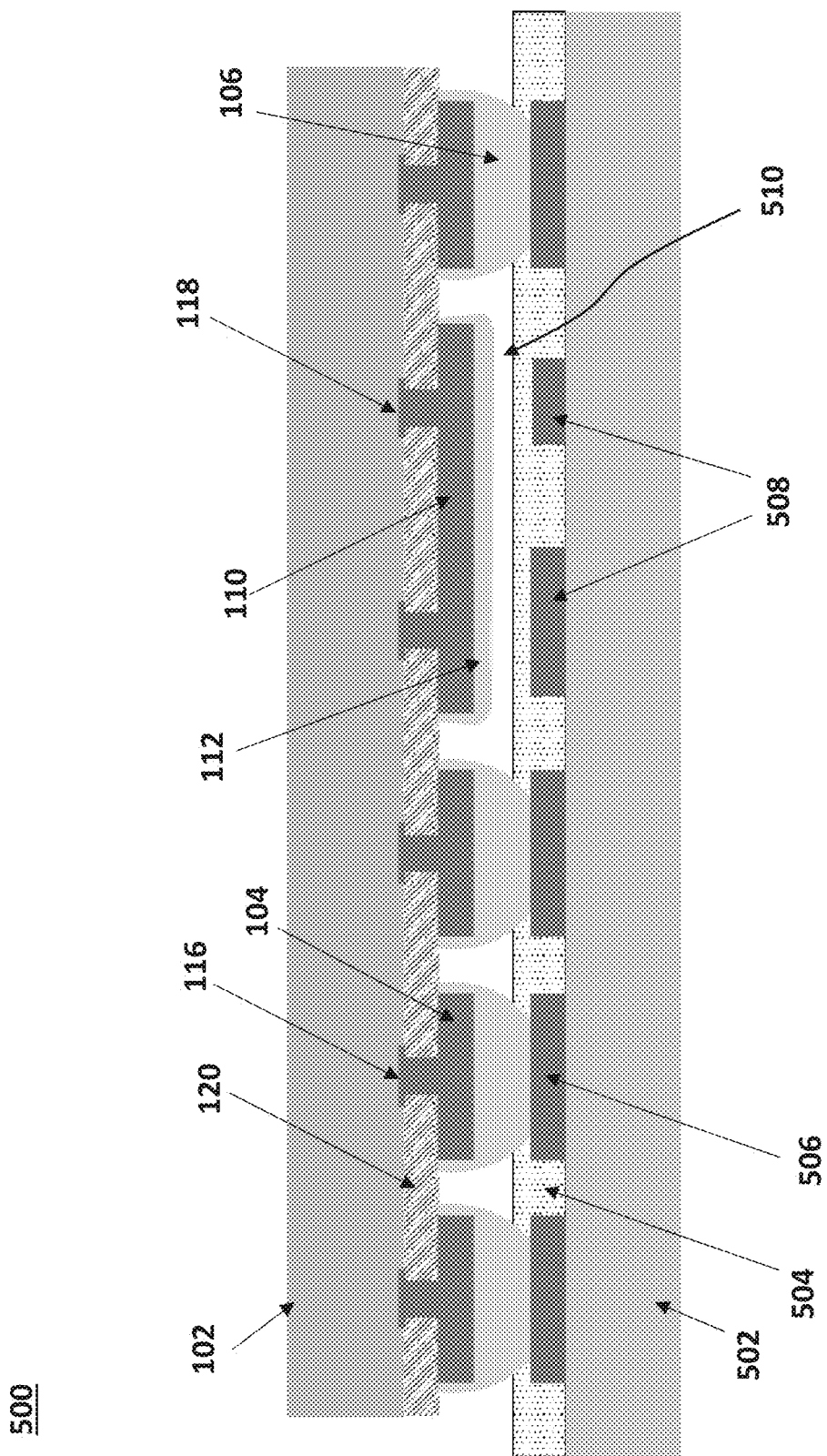
FIGS. 5A-5E are schematic diagrams of example embodiments of a wafer-level package having a solder-based redistribution layer protectant mounted to a substrate in accordance with embodiments of the present disclosure.

FIGS. 5A-5D are schematic diagrams of example embodiments of a wafer-level package having a solder-based redistribution layer protectant mounted to a substrate in accordance with embodiments of the present disclosure. FIG. 5A is a schematic diagram of a semiconductor package 500 that includes a semiconductor die 102 electrically connected to a printed circuit board (PCB) 502. The semiconductor die 102 is electrically connected to the PCB 502 through the solder balls 106. The solder balls 106 can contact PCB landing pads 506. An electrical and mechanical connection can be realized by reflowing the solder to cause the solder to connect to the PCB landing pads 506.

The partial RDL 110 and the protective layer 112 are separated from the PCB 502 by an air gap 510. The air gap 510 permits traces 508 to be used for PCB routing or shielding. The PCB 502 can also include a solder stop 504 for isolating PCB landing pads 506 and for exposing landing pads 506 that are isolated from other portions of the PCB 502.

Figure 5B:
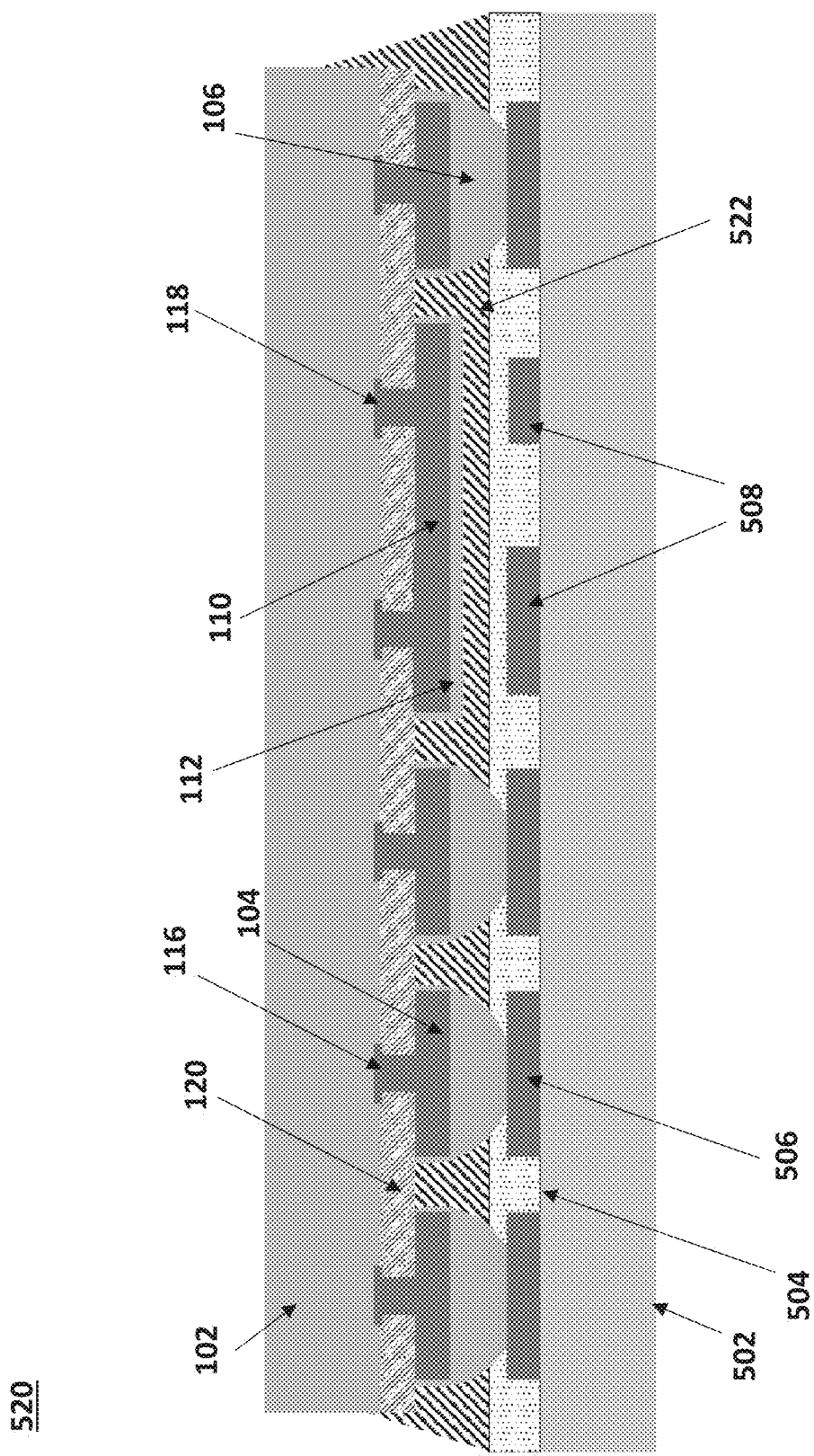
Figure 5C:
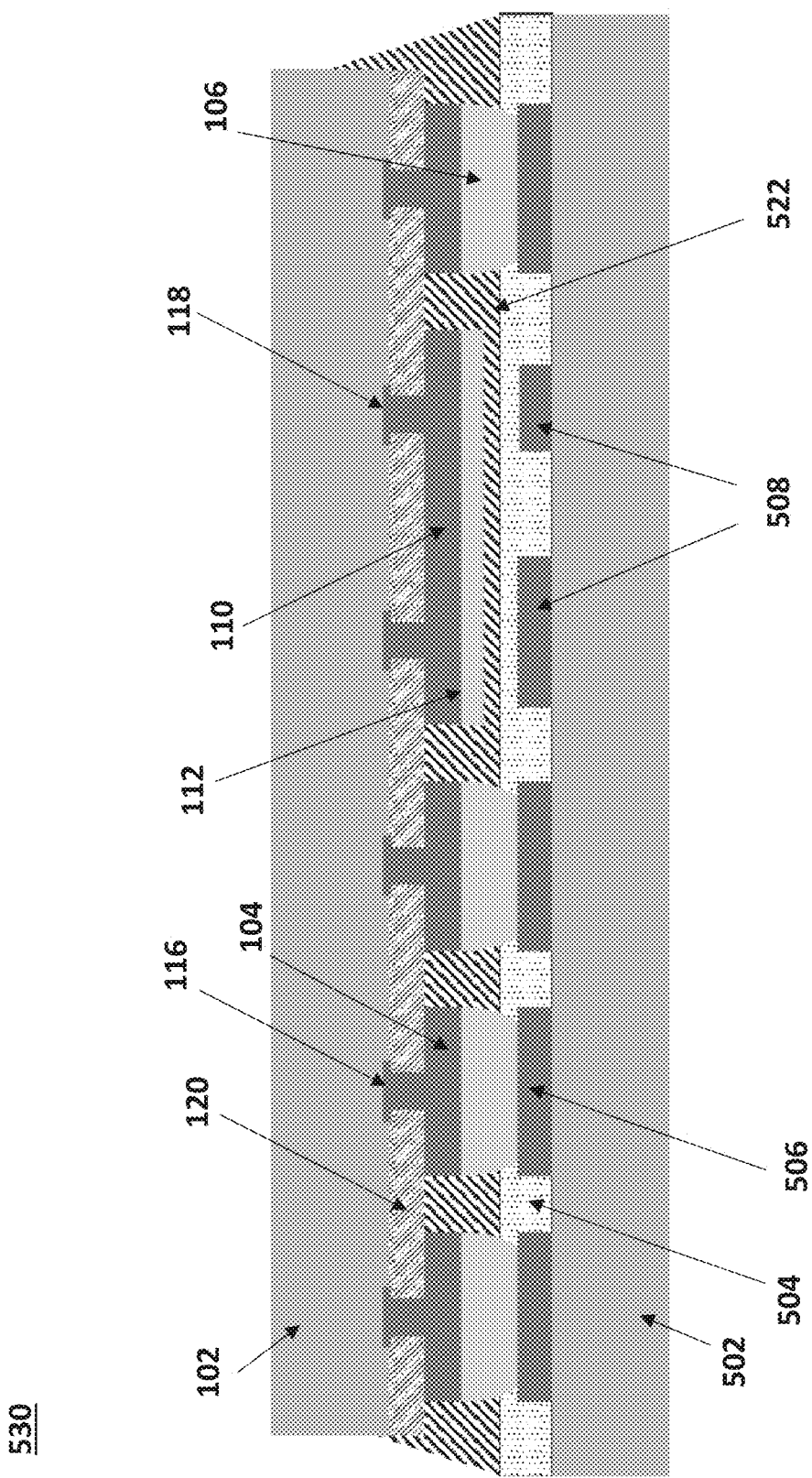

FIG. 5B is a schematic diagram of a semiconductor package 520 that includes a semiconductor die 102 electrically connected to a printed circuit board (PCB) 502. Semiconductor package 520 includes an underfill 522. The underfill 522 can be a mold compound that can protect the exposed portions (e.g., against humidity, short circuiting) of the semiconductor package 520, such as exposed solder or other features. The underfill 522 can be a mold compound or other polymer material, which can be dispensed along the package edge and flowed under the package due to capillary force. In embodiments, an ink process can be used, if the gap between the semiconductor die 102 and the PCB 502 is larger. The underfill 522 can electrically isolate exposed components to prevent short circuiting. Underfilling the package will also improve the thermos-mechanical performance. In embodiments, the sidewalls of interconnect landing pads 104 and the partial RDL 110 can include solder for protection. In embodiments, the use of an underfill 522 can provide protection for the interconnect landing pads and partial RDL, so that forming solder on the sidewalls is unnecessary, as shown in FIG. 5C, which illustrates a semiconductor package 530 that includes an underfill 522 that covers the sidewalls of the interconnect landing pads 104 and the sidewalls of the partial RDL 110.

Figure 5D:
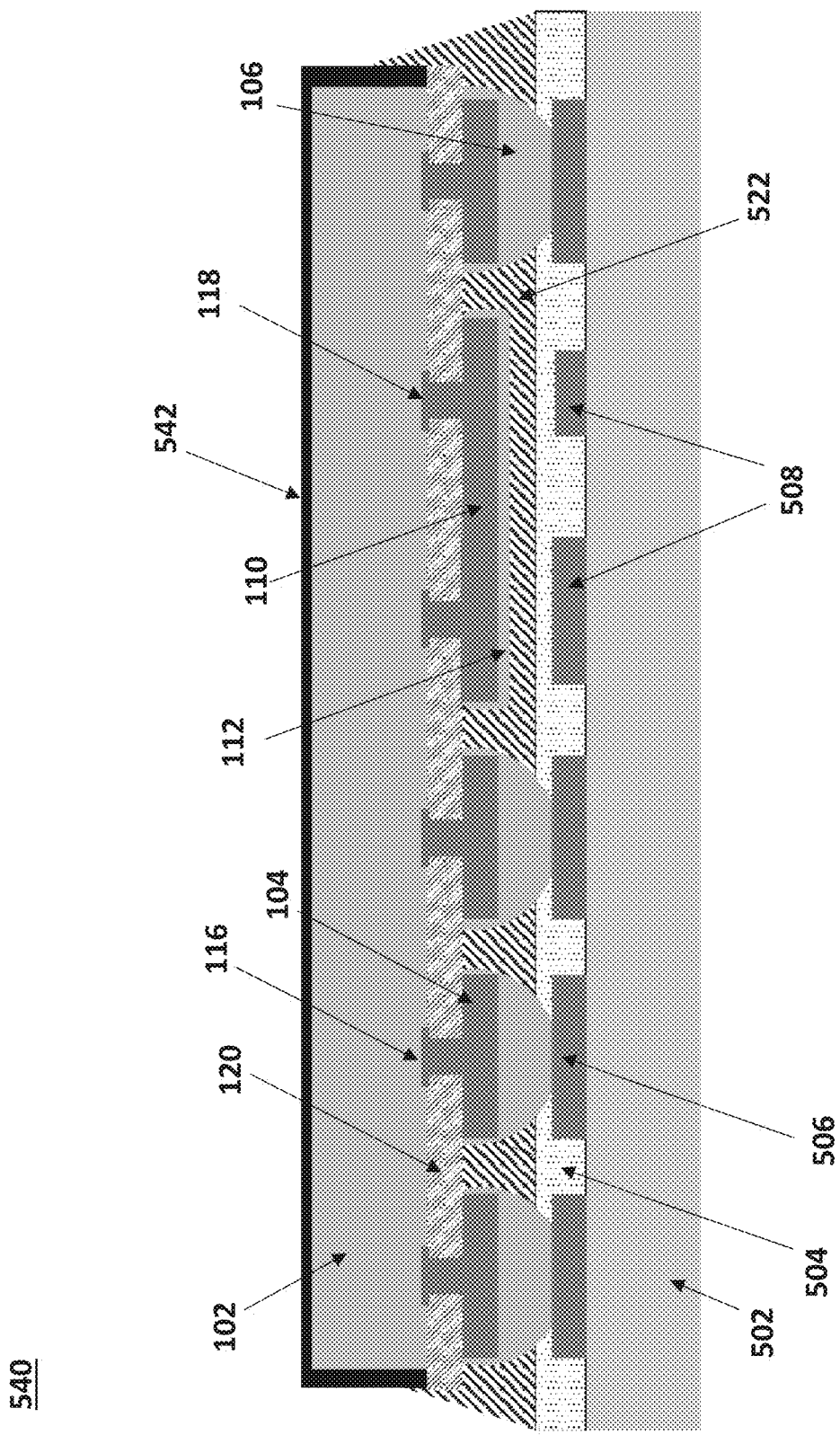
Figure 5E:
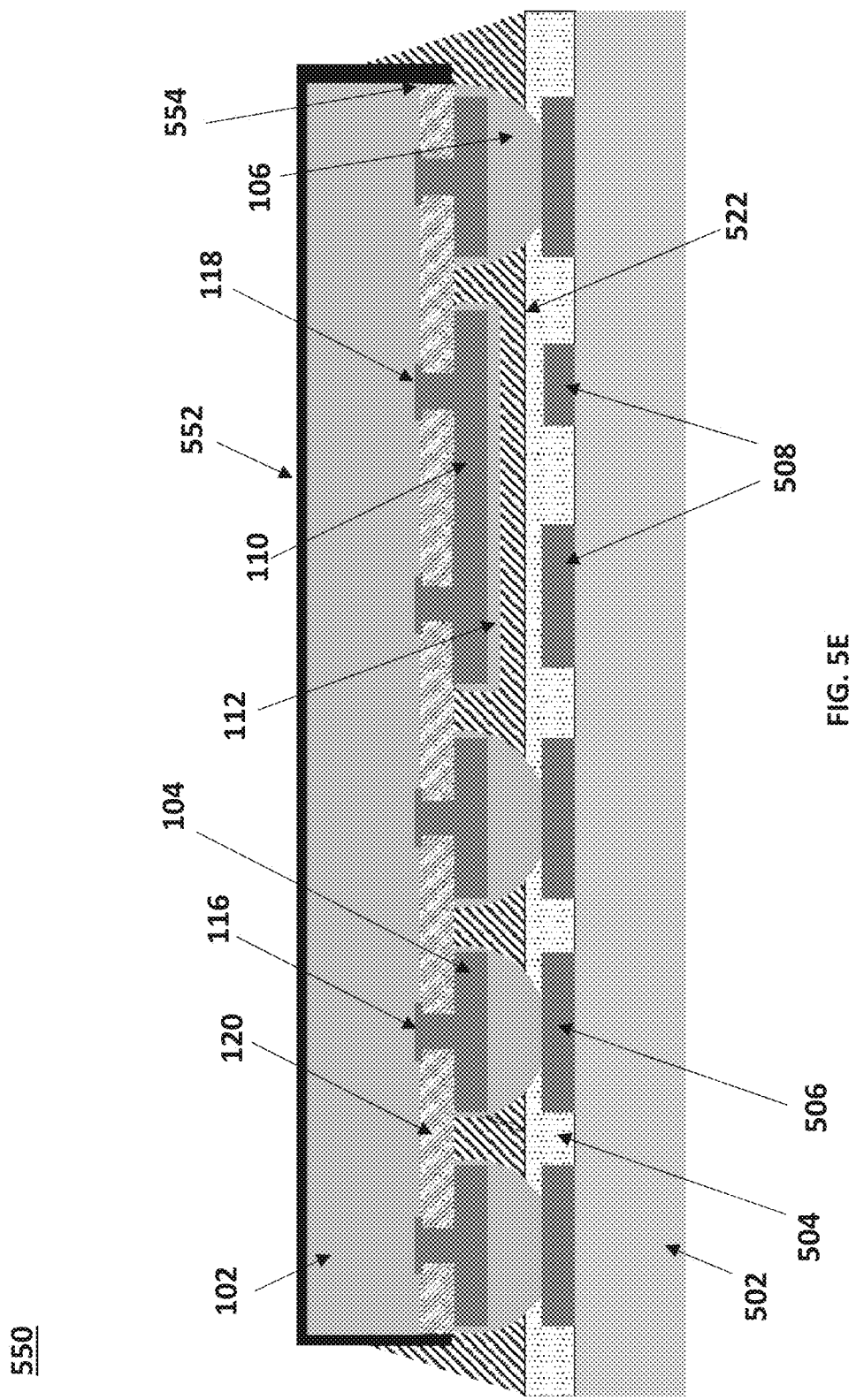

FIG. 5D is a schematic diagram of a semiconductor package 540 that includes a protective compound 542 on a top side and side-walls of the semiconductor die. The protective compound 542 can be a mold compound or other polymer material. In FIG. 5D, the mold compound can cover a surface of the dielectric 120. FIG. 5E is a schematic diagram of a semiconductor package 550 that includes a protective compound 552 on a top side of the semiconductor die. Protective compound 552 can be the same or similar as protective compound 542. In FIG. 5E, the protective compound can cover a sidewall 554 of the dielectric 120.

Figure 6:
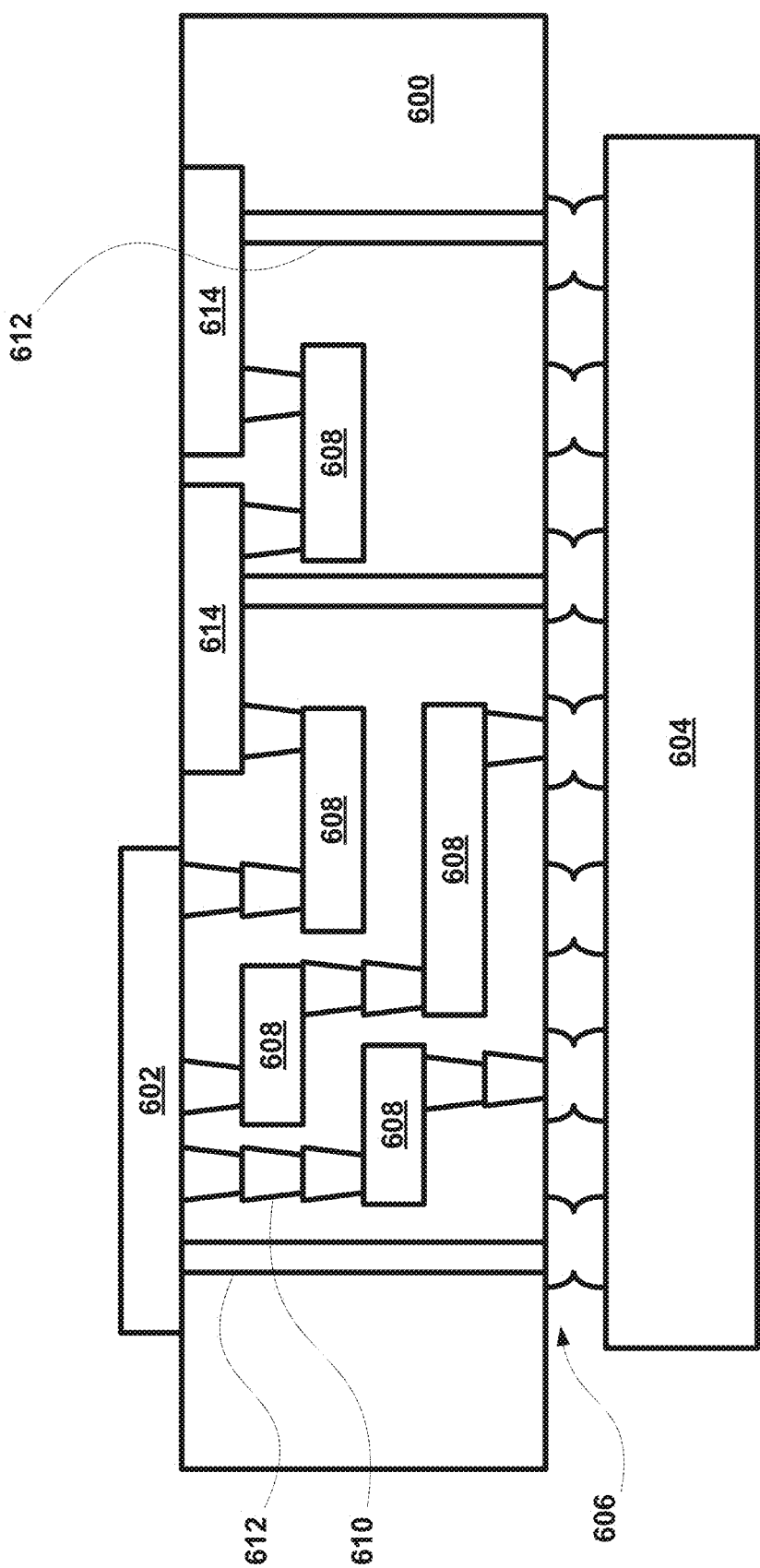
FIG. 6 illustrates an interposer that includes one or more embodiments of the disclosure.

FIG. 6 illustrates an interposer 600 that includes one or more embodiments of the disclosure. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
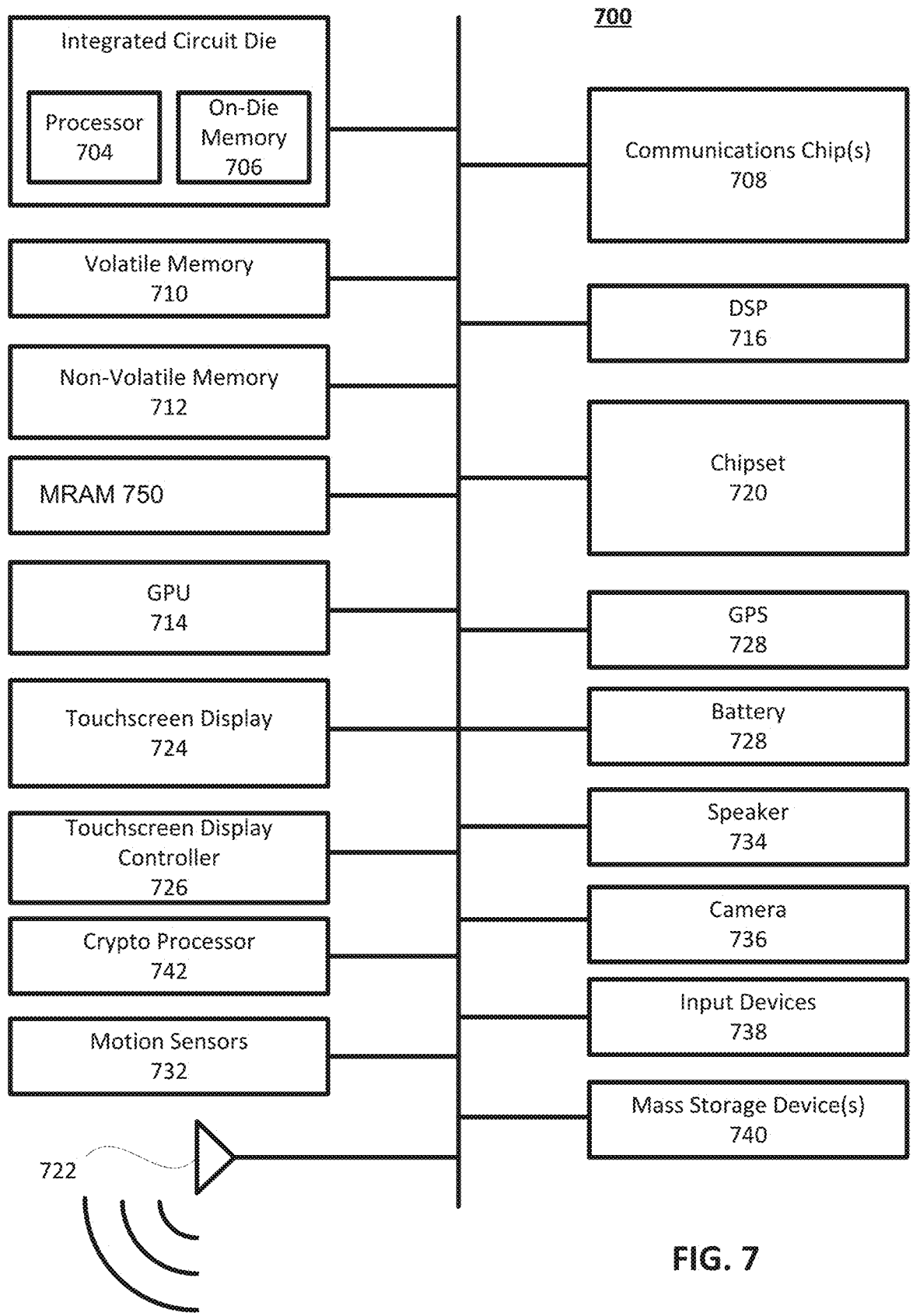
FIG. 7 illustrates a computing device in accordance with one embodiment of the disclosure.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STT-MRAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 728 or other power source, a power amplifier (not shown), a voltage regulator (not shown), a global positioning system (GPS) device 728, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi and Bluetooth and a second communications logic unit 708 may be dedicated to longer range wireless communications such as GPS, EDGE, GPRS, CDMA, WiMAX, LTE, Ev-DO, and others.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The relative sizes of features shown in the figures are not drawn to scale.

The following paragraphs provide examples of various ones of the embodiments disclosed herein.

Example 1 is a semiconductor die that includes one or more interconnect landing pads on an active side of the semiconductor die; a solder material on each of the one or more interconnect landing pads; a partial redistribution layer on the active side of the semiconductor die; and a protection layer on the partial redistribution layer, the protection layer comprising the solder material.

Example 2 may include the subject matter of example 2, and can also include a die pad electrically connecting each of the one or more interconnect landing pads to the semiconductor die; and a dielectric isolating each of the die pads and each of the one or more interconnect landing pads.

Example 3 may include the subject matter of any of examples 1 or 2, and can also include a first die pad electrically connecting a first portion of the partial redistribution layer to a first access point of the semiconductor die and a second die pad electrically connecting a second portion of the partial redistribution layer to a second access point of the semiconductor die, wherein the partial redistribution layer electrically connects the first access point to the second access point.

Example 4 may include the subject matter of any of examples 1 or 2, wherein the solder material covers a sidewall of each of the one or more interconnect landing pads; and the protection layer covers a sidewall of the partial redistribution layer.

Example 5 may include the subject matter of example 1, wherein the partial redistribution layer is patterned as an electrical circuit element electrically coupled to one or more circuit elements within the semiconductor die.

Example 6 may include the subject matter of example 5, wherein the electrical circuit element comprises one of an inductor or a capacitor.

Example 7 may include the subject matter of example 1, wherein the solder material on each of the one or more interconnect landing pads comprises a solder ball, and wherein the protection layer on the partial redistribution layer has a thickness less than a thickness of the solder ball.

Example 8 may include the subject matter of any of examples 1, and also include mold compound covering a top-side of the semiconductor die.

Example 9 may include the subject matter of example 8, wherein the mold compound covers a sidewall of the semiconductor die.

Example 10 is a semiconductor package that includes a printed circuit board (PCB) comprising a PCB an interconnect landing pad and a semiconductor die. The semiconductor die including an interconnect landing pad on an active side of the semiconductor die; a solder material on the interconnect landing pad; a partial redistribution layer on the active side of the semiconductor die; and a protection layer on the partial redistribution layer, the protection layer comprising the solder material. The semiconductor die electrically connected to the PCB by the solder material on the interconnect landing pad, and wherein the partial redistribution layer and the protection layer are separated from the printed circuit board by an air gap.

Example 11 may include the subject matter of example 10, and can also include a first die pad electrically connecting a first portion of the partial redistribution layer to a first access point of the semiconductor die and a second die pad electrically connecting a second portion of the partial redistribution layer to a second access point of the semiconductor die, wherein the partial redistribution layer electrically connects the first access point to the second access point.

Example 12 may include the subject matter of example 10, wherein the solder material on each of the one or more interconnect landing pads comprises a solder ball, and wherein the protection layer on the partial redistribution layer has a thickness less than a thickness of the solder ball.

Example 13 may include the subject matter of example 10, wherein the solder material covers a sidewall of each of the one or more interconnect landing pads; and the protection layer covers a sidewall of the partial redistribution layer.

Example 14 may include the subject matter of example 10, wherein the partial redistribution layer is patterned as an electrical circuit element electrically coupled to one or more circuit elements within the semiconductor die.

Example 15 may include the subject matter of example 10, and can also include a mold compound between the semiconductor die and the printed circuit board, the mold compound filling a space defined by the air gap.

Example 16 is a method of forming a semiconductor package, the method including forming a first die pad and a second die pad on an active side of a semiconductor die; creating a redistribution layer electrically connecting the first die pad to the second die pad; forming a first solder ball on the redistribution layer at a location corresponding to the first die pad and forming a second solder ball on the redistribution layer at a location corresponding to the second die pad; and melting the first and second solder balls to cover the redistribution layer.

Example 17 may include the subject matter of example 16, wherein creating the redistribution layer may include patterning a seed layer on the active side of the semiconductor die and on the first and second die pads; and growing the redistribution layer from the patterned seed layer.

Example 18 may include the subject matter of any of examples 16 or 17, and can also include forming a third die pad on the active side of the semiconductor die; creating an interconnect landing pad electrically connected to the third die pad; forming a third solder ball on the interconnect landing pad; and melting the third solder ball to cover the interconnect landing pad.

Example 19 may include the subject matter of example 18, wherein creating the interconnect landing pad may include patterning a seed layer on the active side of the semiconductor die and on the third die pads; and growing the interconnect landing pad from the patterned seed layer.

Example 20 may include the subject matter of example 16, wherein melting the first and second solder balls includes melting the first and second solder balls to cover a sidewall of the redistribution layer.

Example 21 is a computing device that includes a processor mounted on a substrate; a communications logic unit within the processor; a memory within the processor; a graphics processing unit within the computing device; an antenna within the computing device; a display on the computing device; a battery within the computing device; a power amplifier within the processor; and a voltage regulator within the processor. The computing device also includes a semiconductor package that includes a printed circuit board (PCB); and a semiconductor die. The semiconductor die includes an interconnect landing pad on an active side of the semiconductor die; a solder material on the interconnect landing pad; a partial redistribution layer on the active side of the semiconductor die; and a protection layer on the partial redistribution layer, the protection layer comprising the solder material. The semiconductor die electrically connected to the PCB by the solder material on the interconnect landing pad, and wherein the partial redistribution layer and the protection layer are separated from the printed circuit board by an air gap.

Example 22 may include the subject matter of example 20, and may also include a first die pad electrically connecting a first portion of the partial redistribution layer to a first access point of the semiconductor die and a second die pad electrically connecting a second portion of the partial redistribution layer to a second access point of the semiconductor die, wherein the partial redistribution layer electrically connects the first access point to the second access point.

Example 23 may include the subject matter of any of examples 21-22, wherein the solder material on each of the one or more interconnect landing pads comprises a solder ball, and wherein the protection layer on the partial redistribution layer has a thickness less than a thickness of the solder ball.

Example 24 may include the subject matter of any of examples 21-23, wherein the solder material covers a sidewall of each of the one or more interconnect landing pads; and the protection layer covers a sidewall of the partial redistribution layer.

Example 25 may include the subject matter of any of examples 21-24, wherein the partial redistribution layer is patterned as an electrical circuit element electrically coupled to one or more circuit elements within the semiconductor die.

Example 26 may include the subject matter of any of examples 21-25, and may also include a mold compound between the semiconductor die and the printed circuit board, the mold compound filling a space defined by the air gap.

In the preceding description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

What is claimed is:

1. A semiconductor die structure, comprising:
   a semiconductor die;
   a redistribution structure at a side of the semiconductor die, wherein the redistribution structure includes an interconnect landing pad and an electrical circuit element, wherein the interconnect landing pad and the electrical circuit element are at least partially in a same metal layer of the redistribution structure;
   a first portion of solder material on the interconnect landing pad; and
   a second portion of solder material on the electrical circuit element, wherein a thickness of the first portion of solder material is greater than a thickness of the second portion of solder material.

2. The semiconductor die structure of claim 1, wherein the semiconductor die includes a die pad electrically coupled to the interconnect landing pad.

3. The semiconductor die structure of claim 1, wherein: the second portion of solder material covers a sidewall of the electrical circuit element.

4. The semiconductor die structure of claim 1, wherein the electrical circuit element includes an inductor or a capacitor.

5. The semiconductor die structure of claim 1, wherein the first portion of solder material includes a solder ball.

6. The semiconductor die structure of claim 1, further comprising:
   a mold compound on the semiconductor die.

7. The semiconductor die structure of claim 6, wherein the mold compound covers a sidewall of the semiconductor die.

8. The semiconductor die structure of claim 1, wherein the electrical circuit element is a bridge between different die pads of the semiconductor die.

9. The semiconductor die structure of claim 1, wherein the electrical circuit element has a same thickness as the interconnect landing pad.

10. The semiconductor die structure of claim 1, wherein no solder resist is disposed around the interconnect landing pad.

11. The semiconductor die structure of claim 1, wherein the second portion of solder material does not cover a sidewall of the electrical circuit element.

12. A semiconductor package, comprising:
    a package substrate; and
    a semiconductor die structure, including:
       a semiconductor die,
       a redistribution structure on the semiconductor die, wherein the redistribution structure includes an interconnect landing pad and an electrical circuit element, wherein the interconnect landing pad and the electrical circuit element are at least partially coplanar,
       a first portion of solder material on the interconnect landing pad, and
       a second portion of solder material on the electrical circuit element;
    wherein:
       the semiconductor die is electrically connected to the package substrate by the first portion of solder material on the interconnect landing pad; and
       the second portion of solder material does not contact the package substrate.

13. The semiconductor package of claim 12, wherein the semiconductor die includes a die pad electrically coupled to the interconnect landing pad.

14. The semiconductor package of claim 12, wherein: the second portion of solder material covers a sidewall of the electrical circuit element.

15. The semiconductor package of claim 12, wherein the second portion of solder material does not cover a sidewall of the electrical circuit element.

16. The semiconductor package of claim 12, wherein the electrical circuit element includes an inductor.

17. The semiconductor package of claim 12, wherein the electrical circuit element includes a capacitor.

18. The semiconductor package of claim 12, wherein the first portion of solder material includes a solder ball.

19. The semiconductor package of claim 12, further comprising:
a mold compound on the semiconductor die.

20. The semiconductor package of claim 12, wherein the electrical circuit element is a bridge between different die pads of the semiconductor die.

21. The semiconductor package of claim 12, wherein the electrical circuit element has a same thickness as the interconnect landing pad.

22. The semiconductor package of claim 12, wherein no solder resist is disposed around the interconnect landing pad.

23. The semiconductor package of claim 12, wherein the package substrate includes a printed circuit board (PCB).

24. The semiconductor package of claim 12, wherein a thickness of the first portion of solder material is greater than a thickness of the second portion of solder material.

25. The semiconductor package of claim 12, further comprising:
a mold compound between the second portion of solder material and the package substrate.

* * * * *